(12) United States Patent
Fukuda et al.

(10) Patent No.: US 9,490,281 B2
(45) Date of Patent: Nov. 8, 2016

(54) IMAGE SENSOR AND IMAGE CAPTURING APPARATUS

(71) Applicant: CANON KABUSHIKI KAISHA, Tokyo (JP)

(72) Inventors: Koichi Fukuda, Tokyo (JP); Ryo Yamasaki, Tokyo (JP); Makoto Oikawa, Yokohama (JP); Ichiro Onuki, Kawasaki (JP); Hideaki Yamamoto, Kawasaki (JP); Akihiro Nishio, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 9 days.

(21) Appl. No.: 14/540,066

(22) Filed: Nov. 13, 2014

(65) Prior Publication Data

US 2015/0070548 A1    Mar. 12, 2015

Related U.S. Application Data

(62) Division of application No. 13/442,444, filed on Apr. 9, 2012, now Pat. No. 8,964,079.

(30) Foreign Application Priority Data

Apr. 20, 2011  (JP) ................................ 2011-094370
Jan. 27, 2012  (JP) ................................ 2012-015936

(51) Int. Cl.
   *H01L 27/146*   (2006.01)
   *H04N 5/369*    (2011.01)
   *H04N 9/04*     (2006.01)

(52) U.S. Cl.
   CPC ... *H01L 27/14605* (2013.01); *H01L 27/14621* (2013.01); *H01L 27/14627* (2013.01); *H04N 5/3696* (2013.01); *H04N 9/045* (2013.01)

(58) Field of Classification Search
   CPC .... H04N 5/3696; H04N 5/335; H04N 9/045; H01L 27/146; H01L 27/14605; H01L 27/14627; H01L 27/14621

USPC ......................................................... 348/302
   See application file for complete search history.

(56) References Cited

U.S. PATENT DOCUMENTS 6,819,360 B1 * 11/2004 Ide ................... H01L 27/14627
                                                     257/E27.131
6,999,119 B1 * 2/2006 Shibazaki ............. H04N 9/045
                                                       348/230.1

(Continued)

FOREIGN PATENT DOCUMENTS

JP        2002-314062 A    10/2002

OTHER PUBLICATIONS

Jan. 7, 2016 Japanese Office Action, that issued in Japanese Patent Application No. 2012015936.

*Primary Examiner* — Pritham Prabhakher
(74) *Attorney, Agent, or Firm* — Cowan, Liebowitz & Latman, P.C.

(57) ABSTRACT

An image sensor comprising a plurality of image sensing pixel groups is provided. Each of the image sensing pixel groups has a plurality of first pixels each having photoelectric conversion portions arrayed in first and second directions for first and second numbers of divisions, respectively, and a plurality of second pixels each having photoelectric conversion portions arrayed in the first and second directions for third and fourth numbers of divisions, respectively. The photoelectric conversion portions comprising the first pixel and the second pixel have a function of photoelectrically converting a plurality of images formed by divided light fluxes of a light flux from an imaging optical system and outputting a focus detection signal for phase difference detection. The first and third numbers of division are coprime natural numbers, and the second and fourth numbers of divisions are coprime natural numbers.

8 Claims, 9 Drawing Sheets

(56) References Cited

U.S. PATENT DOCUMENTS

| | | | | |
|---|---|---|---|---|
| 7,715,703 B2* | 5/2010 | Utagawa | ................ | H04N 9/045 |
| | | | | 348/345 |
| 8,466,998 B2* | 6/2013 | Suzuki | .............. | H01L 27/14609 |
| | | | | 348/275 |
| 8,804,027 B2* | 8/2014 | Ichimiya | ............ | H04N 5/23212 |
| | | | | 348/349 |
| 9,338,341 B2* | 5/2016 | Taniguchi | ................ | G02B 7/34 |
| 2008/0084483 A1* | 4/2008 | Kusaka | ............. | H04N 5/23212 |
| | | | | 348/222.1 |
| 2009/0086084 A1* | 4/2009 | Komaba | ................ | G03B 13/18 |
| | | | | 348/349 |
| 2010/0091161 A1* | 4/2010 | Suzuki | .............. | H01L 27/14609 |
| | | | | 348/302 |
| 2010/0194967 A1* | 8/2010 | Amano | .................... | G02B 7/34 |
| | | | | 348/345 |
| 2010/0302433 A1* | 12/2010 | Egawa | .................... | G02B 7/34 |
| | | | | 348/345 |
| 2011/0044678 A1* | 2/2011 | Ogino | ..................... | G02B 7/38 |
| | | | | 396/124 |

\* cited by examiner

FIG. 5A
FIG. 5B
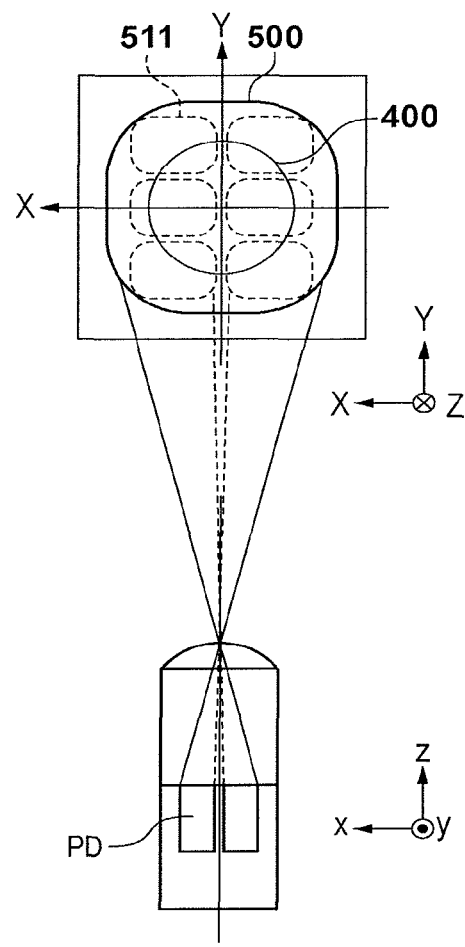
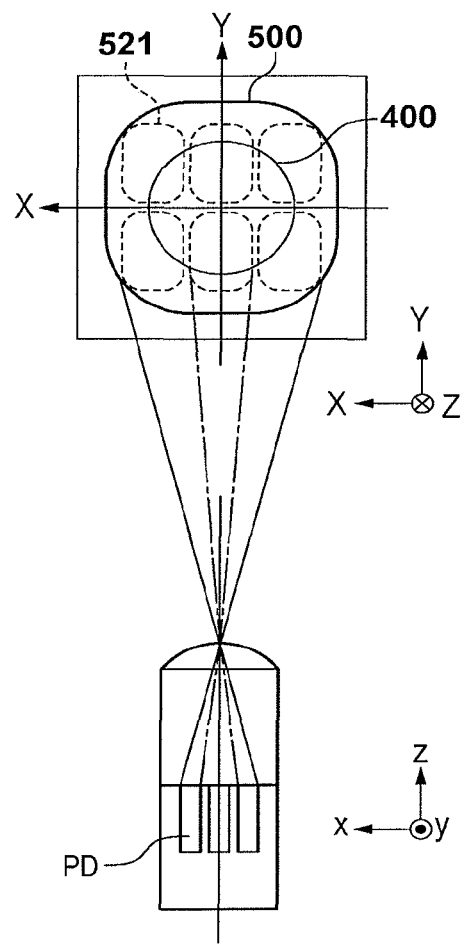

F I G. 6
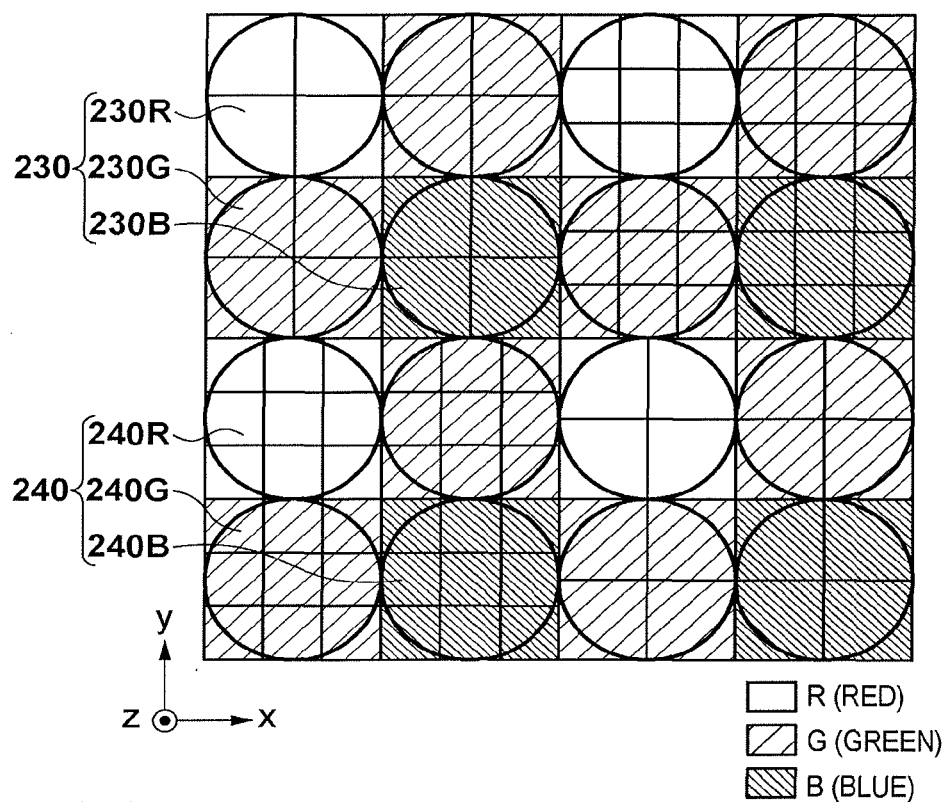
F I G. 7
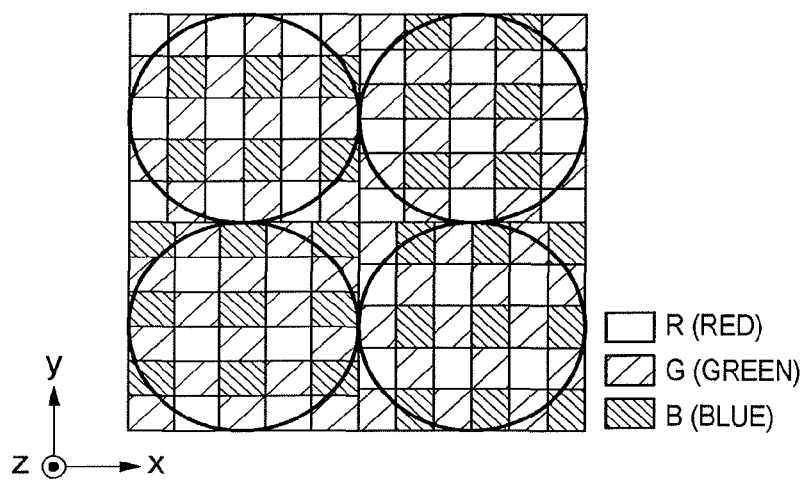

IMAGE SENSOR AND IMAGE CAPTURING APPARATUS

CROSS-REFERENCE TO RELATED APPLICATIONS

This application is a divisional of application Ser. No. 13/442,444, filed Apr. 9, 2012, the entire disclosure of which is hereby incorporated by reference.

BACKGROUND OF THE INVENTION

1. Field of the Invention

The present invention relates to an image sensor and an image capturing apparatus that includes the image sensor.

2. Description of the Related Art

An image capturing apparatus that performs focus detection according to a pupil division phase difference method using a two-dimensional image sensor in which a microlens is formed in each pixel has been proposed as one method for detecting a focus state of a taking lens.

For example, U.S. Pat. No. 4,410,804 discloses an image capturing apparatus that uses a two-dimensional image sensor in which each pixel has one microlens and a plurality of divided photoelectric conversion portions. The divided photoelectric conversion portions are configured to receive light that is transmitted through different regions of an exit pupil of the taking lens through a single microlens, to thus perform pupil division. An image shift amount is determined based on the respective signals for light received by the divided photoelectric conversion portions, focus detection is performed, and signals for light received by the divided photoelectric conversion portions are added together to acquire an imaging signal.

The disclosure of U.S. Pat. No. 4,410,804 is not limited to focus detection, and also discloses that a 3D image can be acquired by displaying, in a separate manner for the right eye and the left eye, parallax signals with respect to light received with photoelectric conversion portions that are divided into left and right in each pixel.

Further, Japanese Patent Laid-Open No. 2009-015164 discloses an apparatus that includes a plurality of pixel columns in which dividing positions of photoelectric conversion portions are different, and that reduces an imbalance in pixel output by selecting an optimal pixel column in accordance with an eccentricity error of a microlens or a pupil change that depends on the kind of interchangeable lens or the image height.

However, the light-receiving sensitivity decreases at a separation band that is formed to separate a plurality of photoelectric conversion portions. There is thus the problem that the separation band forms a low sensitivity band in accordance with the exit pupil shape on the exit pupil of the taking lens through a microlens, and unnatural blurring occurs in a captured image. Further, according to the technology disclosed in Japanese Patent Laid-Open No. 2009-015164, there is the problem that when the f-number of the taking lens is narrowed, the image quality of a captured image deteriorates as a result of a decrease in the pixel output. Furthermore, since all adjacently arranged pixels are divided in the same manner, the pixel output decreases in a continuous manner for a plurality of pixels, and consequently the image quality deteriorates further. Although a decrease in the pixel output can be prevented by setting the f-number of the taking lens to a bright setting when performing focus detection, since it is not possible to apply a restriction to the f-number that is a principal factor for exposure control when capturing an image, this is a significant problem.

SUMMARY OF THE INVENTION

The present invention has been made in consideration of the above situation, and the present invention is to suppress the influence of a low sensitivity band that arises accompanying division of a photoelectric conversion portion.

According to the present invention, provided is an image sensor comprising a plurality of image sensing pixel groups, wherein: each of the plurality of image sensing pixel groups has a plurality of first pixels each having a plurality of photoelectric conversion portions that are arrayed in a first direction for a first number of divisions and in a second direction that is perpendicular to the first direction for a second number of divisions, and a plurality of second pixels each having a plurality of photoelectric conversion portions that are arrayed in the first direction for a third number of divisions and in the second direction for a fourth number of divisions; the plurality of the photoelectric conversion portions comprising the first pixel and the second pixel have a function that photoelectrically converts a plurality of images formed by divided light fluxes of a light flux from an imaging optical system and outputs a focus detection signal that is used for phase difference detection; and the first number of divisions and the third number of division are coprime natural numbers, and the second number of divisions and the fourth number of divisions are coprime natural numbers.

According to another aspect of the present invention, provided is an image sensor comprising a plurality of image sensing pixel groups, wherein: each of the plurality of image sensing pixel groups includes a plurality of pixels each having a plurality of photoelectric conversion portions arrayed in a plurality of different division patterns, respectively; and the plurality of pixels are arranged so that the pixels having the plurality of photoelectric conversion portions arrayed in a same division pattern are not adjacent.

Furthermore, according to still another aspect of the present invention, provided is an image sensor comprising a plurality of image sensing pixel groups, wherein: each of the plurality of image sensing pixel groups includes a plurality of pixels each having a plurality of photoelectric conversion portions divided by a separation band; the plurality of photoelectric conversion portions constituting each pixel included in each of the plurality of image sensing pixel groups have a function that photoelectrically converts a plurality of images formed by divided light fluxes of a light flux from an imaging optical system and outputs a focus detection signal that is used for phase difference detection; and the plurality of pixels comprising each of the plurality of image sensing pixel groups have photoelectric conversion portions that are divided in a plurality of different division patterns by the separation band.

Further, according to still another aspect of the present invention, provided is an image sensor comprising a plurality of image sensing pixel groups, wherein: each of the plurality of image sensing pixel groups includes a plurality of pixels each having a plurality of photoelectric conversion portions that are divided by a separation band in at least one direction among a first direction and a second direction that is perpendicular to the first direction; the plurality of photoelectric conversion portions constituting each pixel included in each of the plurality of image sensing pixel groups have a function that photoelectrically converts a plurality of images formed by divided light fluxes of a light flux from an imaging optical system and outputs a focus detection signal that is used for phase difference detection; and the plurality of pixels comprising respective image sensing pixel groups adjacent in the first direction and in the second direction among the plurality of image sensing pixel groups have photoelectric conversion portions that are divided by the separation band in a plurality of division patterns that are different to each other.

Further, according to still another aspect of the present invention, provided is an image capturing apparatus, including: any of the image sensors as described above; and a control unit configured to perform focus adjustment by a phase difference detection method using the focus detection signal.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

FIG. 5A and FIG. 5B are schematic explanatory views that illustrate pupil division according to the first embodiment;

FIG. 6 is a schematic view of a pixel array according to a second embodiment;

FIG. 7 is a schematic view of a pixel array according to a third embodiment;

DESCRIPTION OF THE EMBODIMENTS

Exemplary embodiments of the present invention will be described in detail in accordance with the accompanying drawings. The dimensions, shapes and relative positions of the constituent parts shown in the embodiments should be changed as convenient depending on various conditions and on the structure of the apparatus adapted to the invention, and the invention is not limited to the embodiments described herein.

Figure 1:
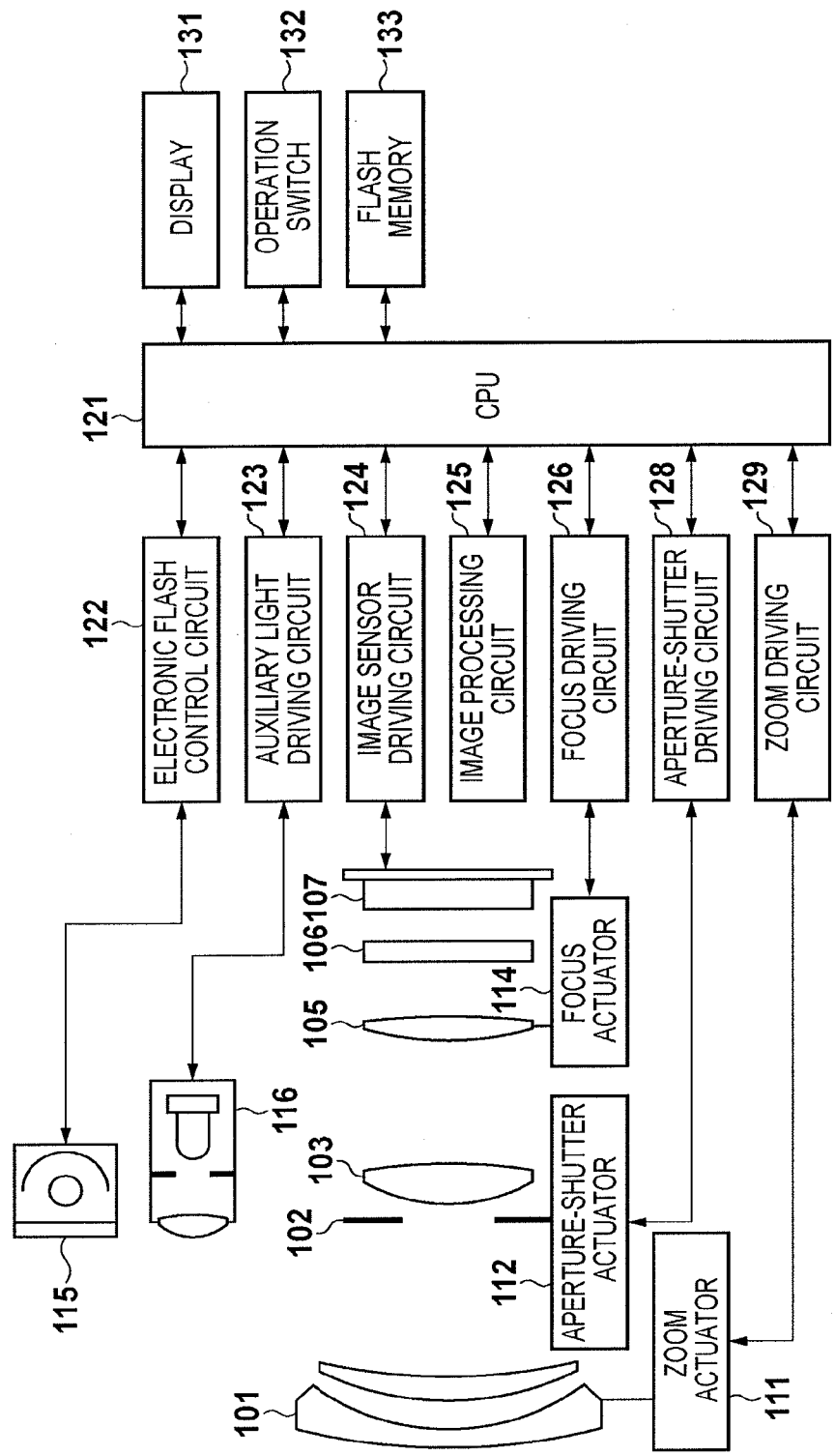
FIG. 1 is a view that illustrates a schematic configuration of a camera according to an embodiment of the present invention.

FIG. 1 is a view that shows a schematic configuration of a camera as an image capturing apparatus having an image sensor according to the present invention. In FIG. 1, reference numeral 101 denotes a first lens group that is arranged at the distal end of a photographing optical system (image-forming optical system), and is held so as to be movable back and forth in the optical axis direction. Reference numeral 102 denotes an aperture-shutter that not only adjusts a light amount at a time of photographing by adjusting the aperture diameter thereof, but also includes a function as an exposure time adjustment shutter when photographing a still image. Reference numeral 103 denotes a second lens group. The aperture-shutter 102 and the second lens group 103 are configured to move back and forth as a single unit in the optical axis direction so as to implement a variable magnification function (zoom function) in association with back and forth movement of the first lens group 101.

Reference numeral 105 denotes a third lens group that performs focus adjustment by moving forward and backward in the optical axis direction. Reference numeral 106 denotes an optical low-pass filter that is an optical element used to reduce false color and moire in a photographic image. Reference numeral 107 denotes an image sensor that is constituted by a two-dimensional CMOS sensor and peripheral circuits thereof. Each pixel constituting the image sensor 107 has a plurality of divided photoelectric conversion portions, and by independently reading out output signals of the divided photoelectric conversion portions it is possible to obtain parallax images and perform focus adjustment of a photographing optical system in the manner described in U.S. Pat. No. 4,410,804. The plurality of photoelectric conversion portions include a function that photoelectrically converts a plurality of images formed by divided light fluxes of the light flux from the imaging optical system and outputs focus detection signals that are used for phase difference detection. On the other hand, when obtaining a photographic image, the output signals of the divided photoelectric conversion portions can be added to obtain an output signal of a single pixel. Thus, the image sensor 107 of the present invention not only forms a photographic image, but also includes a function that obtains parallax images and performs focus detection.

Reference numeral 111 denotes a zoom actuator that drives the components from the first lens group 101 to the third lens group 105 back and forth in the optical axis direction by rotating an unshown cam cylinder to execute a magnifying operation. Reference numeral 112 denotes an aperture-shutter actuator configured to control the aperture diameter of the aperture-shutter 102 to adjust the photographing light quantity, and also controls the exposure time when photographing a still image. Reference numeral 114 denotes a focus actuator configured to drive the third lens group 105 back and forth in the optical axis direction to execute focus adjustment.

Reference numeral 115 denotes an electronic flash configured to illuminate an object when photographing. A flash illumination device using a xenon tube is preferably used as the electronic flash 115. Alternatively, an illumination device including an LED which continuously emits light may be used. Reference numeral 116 denotes an AF auxiliary light-emitting unit configured to project an image of a mask having a predetermined opening pattern toward an object field via a projection lens to enhance the focus detection capability for a dark object or a low-contrast object.

Reference numeral 121 denotes a camera CPU that controls various operations of the camera main body. The CPU 121 has, inter alia, a computation unit, a ROM, a RAM, an A/D converter, a D/A converter, and a communication interface circuit. The CPU 121 drives various circuits of the camera and executes a series of operations, such as AF, photographing, image processing and recording, based on a predetermined program stored in the ROM.

Reference numeral 122 denotes an electronic flash control circuit that controls the electronic flash 115 to emit light in synchronization with a photographing operation. Reference numeral 123 denotes an auxiliary light driving circuit that controls the AF auxiliary light-emitting unit 116 so as to emit light in synchronization with a focus detection operation. Reference numeral 124 denotes an image sensor driving circuit that controls image sensing operations of the image sensor 107, subjects acquired image signals to analog-to-digital conversion, and sends the resultant signals to the CPU 121. Reference numeral 125 denotes an image processing circuit that performs processes such as gamma conversion, color interpolation, and JPEG compression on an image acquired by the image sensor 107.

Reference numeral 126 denotes a focus driving circuit configured to drive and control the focus actuator 114 based on the results of focus detection, and perform focus adjustment by moving the third lens group 105 back and forth in the optical axis direction. Reference numeral 128 denotes an aperture-shutter driving circuit configured to drive and control the aperture-shutter actuator 112 so as to control the aperture of the aperture-shutter 102. Reference numeral 129 denotes a zoom driving circuit configured to drive the zoom actuator 111 in response to a zoom operation by a photographer.

Reference numeral 131 denotes a display, such as an LCD, configured to display information regarding a photographing mode of the camera, preview images before photographing, confirmation images after photographing, focus state display images at the time of focus detection, and the like. Reference numeral 132 denotes an operation switch group that includes a power switch, a release (photographing trigger) switch, a zoom operation switch, a photographing mode selection switch, or the like. Reference numeral 133 denotes a detachable flash memory that is configured to record photographed images.

<First Embodiment>

Figure 2:
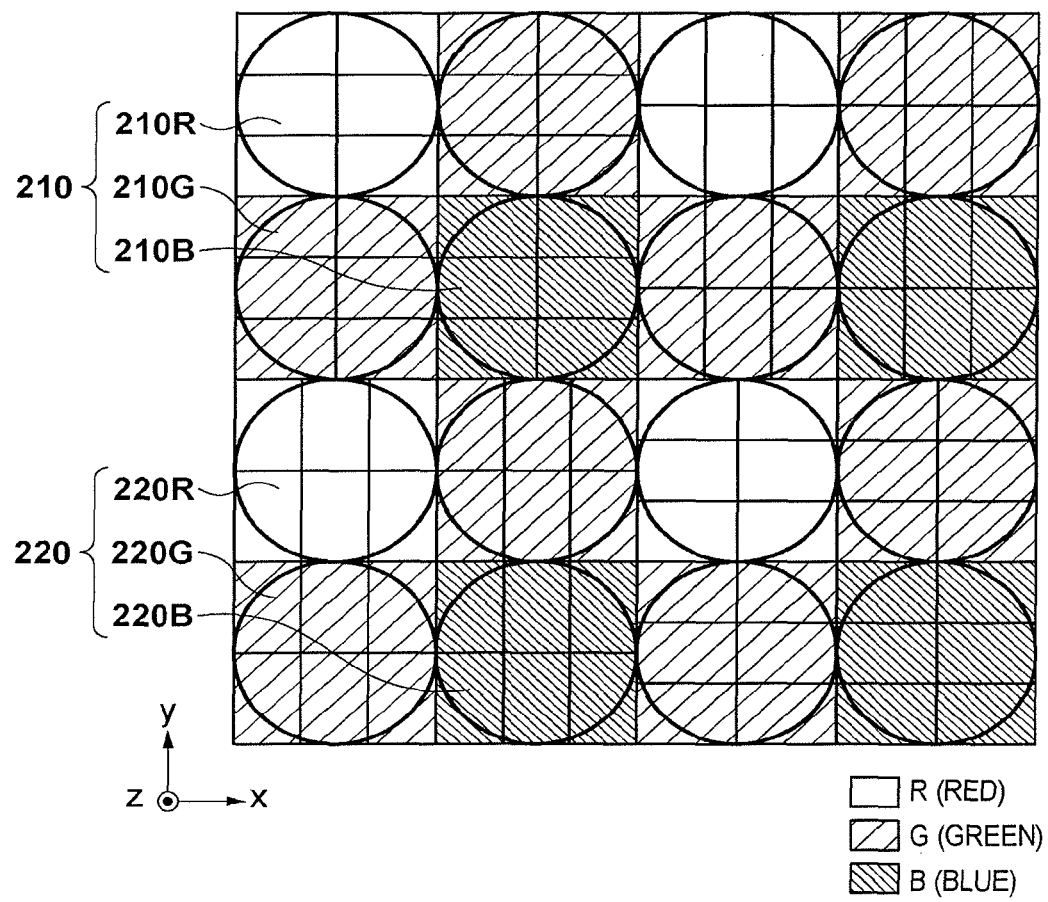
FIG. 2 is a schematic view of a pixel array according to a first embodiment.

FIG. 2 is a view that illustrates a pixel array of the image sensor 107 shown in FIG. 1 according to a first embodiment that shows a pixel range of 4 columns×4 rows. A large number of the pixel arrays of 4 columns×4 rows shown in FIG. 2 are arranged on a plane, making it possible to acquire high-resolution images. In the first embodiment, it is assumed that the pixel pitch is 4 µm, the effective pixel count is a total of approximately 10,670,000 pixels that includes 4,000 columns in the lateral direction and 2,667 rows in the vertical direction, and the image sensor size is 36 mm (horizontally)×24 mm (vertically).

According to the first embodiment, in the pixel array shown in FIG. 2, pixels of 2 columns×2 rows on the left upper part of the pixel array are taken as a first image sensing pixel group 210. In the first image sensing pixel group 210, first pixels 210G having spectral sensitivity to G (green) are arranged as two diagonally opposed pixels, and a first pixel 210R having spectral sensitivity to R (red) and a first pixel 210B having spectral sensitivity to B (blue) are arranged as the other two pixels. Further, in the pixel array shown in FIG. 2, pixels of 2 columns×2 rows on the left lower part of the pixel array are taken as a second image sensing pixel group 220. In the second image sensing pixel group 220, second pixels 220G having spectral sensitivity to G are arranged as two diagonally opposed pixels, and a second pixel 220R having spectral sensitivity to R and a second pixel 220B having spectral sensitivity to B are arranged as the other two pixels. Hereunder, a pixel included in the first image sensing pixel group 210 is described as "first pixel 210RGB", and a pixel included in the second image sensing pixel group 220 is described as "second pixel 220RGB".

Figure 3A:
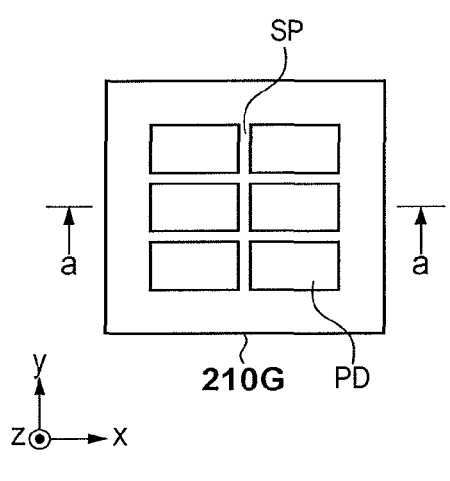
FIG. 3A and FIG. 3B are a schematic plan view and a schematic cross-sectional view of a first pixel according to the first embodiment.
Figure 3B:
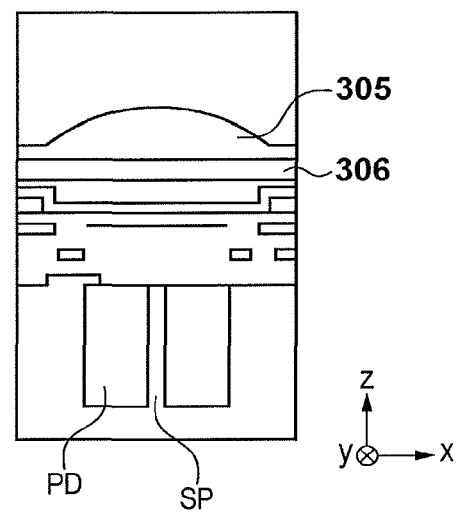
Figure 4A:
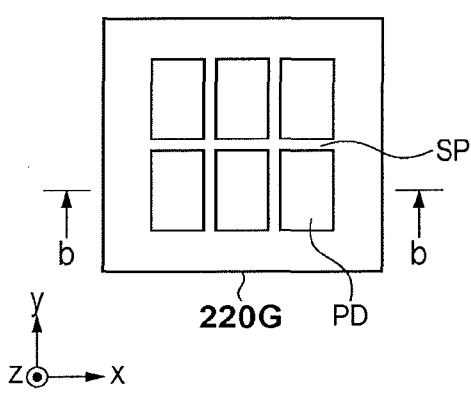
FIG. 4A and FIG. 4B are a schematic plan view and a schematic cross-sectional view of a second pixel according to the first embodiment.
Figure 4B:
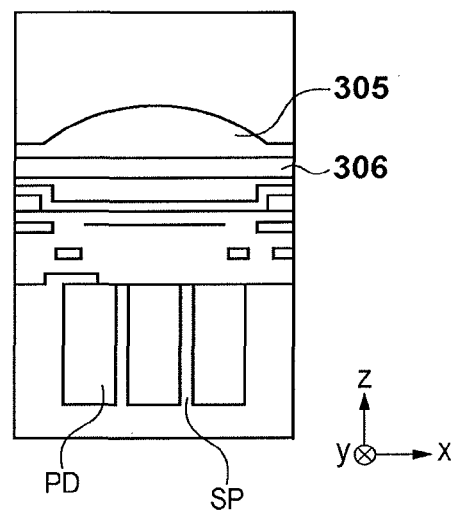

FIG. 3A is a plan view of one first pixel 210RGB in the first image sensing pixel group 210 shown in FIG. 2, as seen from a light-receiving surface side (+z side) of the image sensor 107. FIG. 3B is a cross-sectional view of a cross-section a-a in FIG. 3A as viewed from a −y side. FIG. 4A is a plan view of one second pixel 220RGB of the image sensor shown in FIG. 2, as seen from the light-receiving surface side (+z side) of the image sensor 107. FIG. 4B is a cross-sectional view of a cross-section b-b in FIG. 4A as viewed from the −y side.

As shown in FIG. 3A and FIG. 3B, a microlens 305 for converging incident light is formed on a light-receiving side in the first pixel 210RGB of the first embodiment. A plurality of photoelectric conversion portions PD, divided by separation bands and arrayed M1 by N1 in the x-direction and the y-direction, respectively (M1 is 2 and N1 is 3, according to the first embodiment), are formed. In this case, M1 and N1 are natural numbers. Further, as shown in FIG. 4A and FIG. 4B, a microlens 305 for converging incident light is formed on a light-receiving side in the second pixel 220RGB of the first embodiment. A plurality of photoelectric conversion portions PD, divided by separation bands and arrayed M2 by N2 in the x-direction and in the y-direction, respectively (M2 is 3 and N2 is 2 according to the first embodiment), are formed. In this case, M2 and N2 are natural numbers. According to the first embodiment, the first pixel having multiple divided photoelectric conversion portions arrayed M1×N1, and the second pixel having multiple divided photoelectric conversion portions arrayed M2×N2 are formed so that M1 and M2 are coprime, and N1 and N2 are coprime.

In this connection, the photoelectric conversion portions PD may be formed as photodiodes with a PIN structure in which an intrinsic layer is sandwiched between a p-type layer and an n-type layer. Further, as necessary, a configuration may also be adopted in which the intrinsic layer is omitted and the photoelectric conversion portions PD are formed as p-n junction photodiodes.

In the first pixel 210RGB and the second pixel 220RGB, a color filter 306 is formed between the microlens 305 and the photoelectric conversion portions PD. Note that, the color filter may be omitted as necessary.

Light that is incident on the first pixel 210RGB and the second pixel 220RGB shown in FIGS. 3A and 3B, and FIGS. 4A and 4B, respectively, is converged by the microlens 305 and spectrum-separated by the color filter 306, and thereafter is received by the photoelectric conversion portions PD. At the photoelectric conversion portions PD, pairs of electrons and holes are generated, and after being separated in a depletion layer, negatively charged electrons accumulate in an n-type layer (not shown) and the holes are discharged to outside the image sensor 107 through a p-type layer that is connected to a constant voltage source (unshown).

Similarly, pairs of electrons and holes are also generated in accordance with a received light amount at the separation bands (dead bands) SP which separate the photoelectric conversion portions PD. However, if the width of the separation bands SP is wide in comparison to the charge diffusion length, some of the generated pairs of electrons and holes will recombine and re-emit light before reaching the adjacent depletion layer of the photoelectric conversion portion PD and being separated. Consequently, the light-receiving sensitivity in the separation bands SP decreases relative to the photoelectric conversion portions PD.

FIG. 5A and FIG. 5B are schematic explanatory views that show the correlation between the divided photoelectric conversion portions PD of a pixel and pupil division. FIG. 5A includes a cross-sectional view along a cross-section a-a of the first pixel 210RGB shown in FIG. 3A as viewed from the +y side, and a view showing an exit pupil surface of the image-forming optical system. FIG. 5B includes a cross-sectional view along a cross-section b-b of the second pixel 220RGB shown in FIG. 4A as viewed from the +y side, and a view showing an exit pupil surface of the image-forming optical system. In this connection, in FIG. 5A and FIG. 5B, to correspond with the coordinate axes of the exit pupil surfaces, the x-axis and y-axis in the cross-sectional views are inverted relative to FIG. 3A, FIG. 3B, FIG. 4A, and FIG. 4B.

Reference numeral 511 in FIG. 5A denotes a pupil intensity distribution of the photoelectric conversion portions PD, arrayed M1×N1 (2×3), of the first pixel 210RGB, and shows pupil regions that can receive light in the first pixel 210RGB, and that is approximately conjugate with the light-receiving surface of the photoelectric conversion portions PD with respect to the microlens. Further, reference numeral 521 in FIG. 5B denotes a pupil intensity distribution of the photoelectric conversion portions PD, arrayed M2×N2 (3×2), of the second pixel 220RGB, and shows pupil regions that can receive light in the second pixel 220RGB, and that is approximately conjugate with the light-receiving surface of the photoelectric conversion portions PD with respect to the microlens. Further, exit pupils 400 and 500 of the image-forming optical system are the pupil intensity distribution of the entire pixel when the divided photoelectric conversion portions PD are all combined. A light flux from an object passes through the exit pupil 400 or 500 of the image-forming optical system and is incident on the respective pixels.

Although the pupil distance is several tens of mm, the diameter of the microlens 305 is several μm. Consequently, the aperture value of the microlens 305 is several tens of thousands, and diffraction blur of a level of several tens of mm occurs. Hence, an image on the light-receiving surface of the photoelectric conversion portion PD is a light-receiving ratio distribution that does not become a clear region.

Further, the light-receiving sensitivity is low in the separation bands SP formed to separate the photoelectric conversion portions PD. The separation bands SP cause low sensitivity bands that are in accordance with the exit pupil shape to be generated on the exit pupil of the image-forming optical system through the microlens 305. Low sensitivity bands are formed between the regions indicated by dashed lines of the pupil intensity distribution 511 of the first pixel 210RGB and between the regions indicated by dashed lines of the pupil intensity distribution 521 of the second pixel 220RGB, respectively. When a low sensitivity band is formed in the pupil intensity distribution, unnatural blurring occurs in a captured image.

According to the first embodiment, the first pixel 210RGB having the M1×N1 (2×3) photoelectric conversion portions PD, and the second pixel 220RGB having the M2×N2 (3×2) photoelectric conversion portions PD are configured as follows. Specifically, the first pixel 210RGB and the second pixel 220RGB are configured so that M1 and M2 are coprime and N1 and N2 are coprime. It is thus possible to make a region of a low sensitivity band formed in the pupil intensity distribution of the first pixel 210RGB and a region of a low sensitivity band formed in the pupil intensity distribution of the second pixel 220RGB different to each other, and thereby average and suppress the influences of the low sensitivity bands.

When an image capturing apparatus (camera) in which the image sensor 107 of the present invention is mounted is in a lateral position, a parallax image in the x-direction (horizontal direction) can be acquired by adding the signals of the divided photoelectric conversion portions PD in only the y-direction (vertical direction). Likewise, when the image capturing apparatus (camera) is in a vertical position, a parallax image in the y-direction (vertical direction) can be acquired by adding the signals of the divided photoelectric conversion portion PD in only the x-direction (horizontal direction). In order to correspond to both a lateral position and a vertical position of the camera in this manner, it is desirable that the M1, N1, M2, and N2 are each a value of 2 or more.

It is also desirable that the number (M1×N1) of the photoelectric conversion portions PD of the first pixel 210RGB and the number (M2×N2) of the photoelectric conversion portions PD of the second pixel 220RGB are equal. Thus, the number of wiring lines required for controlling the first pixel 210RGB and the second pixel 220RGB can be made uniform, thereby simplifying the wiring and facilitating manufacture. Further, the light-receiving areas of the first pixel 210RGB and the second pixel 220RGB can be made uniform.

In addition, in order to make the shapes of the light-receiving areas of the divided photoelectric conversion portions close to a square shape, it is desirable that a difference between M1 and N1 is 1, and a difference between M2 and N2 is 1.

Furthermore, as shown in FIG. 2, in order to average the influences of the low sensitivity bands to a greater degree, it is desirable that first pixels and second pixels that have color filters of the same color are not adjacent.

According to the above configuration, it is possible to realize an image capturing apparatus in which the influence of a separation band (low sensitivity band) that is generated accompanying division of a photoelectric conversion portion can be suppressed, that is less apt to be affected by a deterioration in image quality caused by a separation band inside a pixel, and that can acquire stable photographic images.

<Second Embodiment>

Next, a second embodiment of the present invention will be described. FIG. 6 is a view that illustrates a pixel array of the image sensor 107 shown in FIG. 1 according to the second embodiment that shows a pixel range of 4 columns×4 rows. A large number of the 4 columns×4 rows of pixels shown in FIG. 6 are arranged on a plane, making it possible to acquire high resolution images.

According to the second embodiment, in the pixel array shown in FIG. 6, the pixels of 2 columns×2 rows on the left upper part of the pixel array are taken as a first image sensing pixel group 230. In the first image sensing pixel group, first pixels 230G having spectral sensitivity to G (green) are arranged as two diagonally opposed pixels, and a first pixel 230R having spectral sensitivity to R (red) and a first pixel 230B having spectral sensitivity to B (blue) are arranged as the other two pixels. Further, in the pixel array shown in FIG. 6, the pixels of 2 columns×2 rows on the left lower part of the pixel array are taken as a second image sensing pixel group 240. In the second image sensing pixel group 240, second pixels 240G having spectral sensitivity to G are arranged as two diagonally opposed pixels, and a second pixel 240R having spectral sensitivity to R and a second pixel 240B having spectral sensitivity to B are arranged as the other two pixels. Hereunder, a pixel included in the first image sensing pixel group 230 is described as "first pixel 230RGB", and a pixel included in the second image sensing pixel group 240 is described as "second pixel 240RGB".

In the first pixels 230RGB of the second embodiment, a microlens for converging incident light is formed on a light-receiving side of each pixel. Further, a plurality of photoelectric conversion portions PD, divided by separation bands and arrayed M1 by N1 in the x-direction and the y-direction, respectively (M1 is 2 and N1 is 2, according to the second embodiment), are formed. Further, in the second pixel 240RGB of the second embodiment, a microlens for converging incident light is formed on a light-receiving side. Furthermore, a plurality of photoelectric conversion portions PD, divided by separation bands and arrayed M2 by N2 in the x-direction and in the y-direction, respectively (M2 is 3 and N2 is 3, according to the second embodiment), are formed. The remaining configuration is the same as in the above described first embodiment.

According to the above configuration, similarly to the above described first embodiment, the influence of a low sensitivity band that is generated accompanying division of photoelectric conversion portions can be suppressed.

<Third Embodiment>

Next, a third embodiment of the present invention is described. FIG. 7 is a view that illustrates a pixel array of the image sensor 107 shown in FIG. 1 according to the third embodiment that shows a pixel range of 2×2 rows. The pixels on the upper left and the lower right are referred to as "first pixels", and the pixels on the upper right and lower left are referred to as "second pixels". A single image sensing pixel group is constituted by four pixels of 2×2 rows.

In each of the first pixels of the third embodiment, a microlens for converging incident light is formed on a light-receiving side of each pixel, and a plurality of divided photoelectric conversion portions PD, arrayed six by five in the x-direction and in the y-direction, respectively (M1=6, N1=5), are formed. Color filters of one of the colors R, G, and B are formed so that adjacent colors are different to each other in correspondence with each of the divided photoelectric conversion portions PD. In the second pixels of the third embodiment, a microlens for converging incident light is formed on a light-receiving side of each pixel, and a plurality of divided photoelectric conversion portions PD, arrayed five by six in the x-direction and in the y-direction, respectively (M2=5, N2=6), are formed. Color filters of one of the colors R, G, and B are formed so that adjacent colors are different to each other in correspondence with each of the divided photoelectric conversion portions PD. The remaining configuration is the same as in the above described first embodiment.

According to the above configuration, similarly to the above described first embodiment, the influence of a low sensitivity band that is generated accompanying division of photoelectric conversion portions can be suppressed.

<Fourth Embodiment>

Next, a fourth embodiment of the present invention is described. According to the fourth embodiment, a two-dimensional single-panel color sensor in which primary color mosaic filters arranged in a Bayer array are formed on-chip on light-receiving pixels arranged in a square with M pixels in the lateral direction and N pixels in the vertical direction is used as the image sensor 107.

Figure 8:
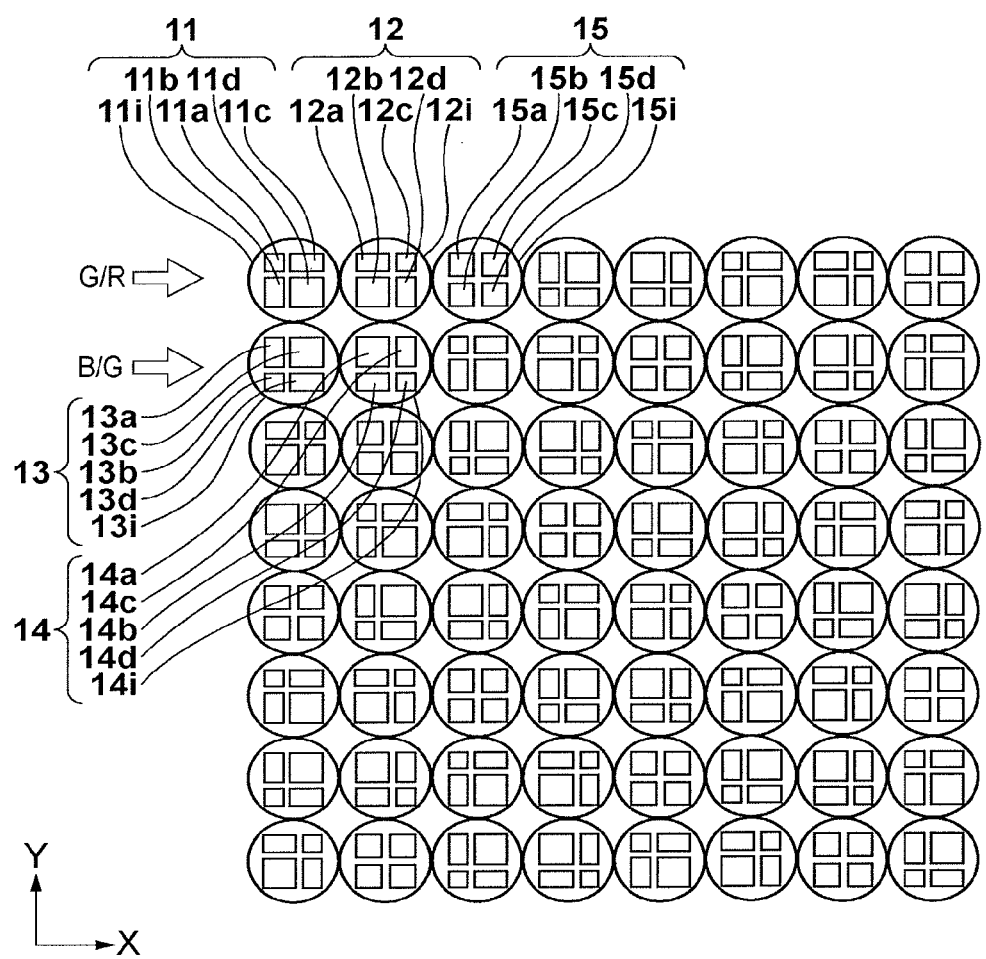
FIG. 8 is a schematic view of a pixel array according to a fourth embodiment.

FIG. 8 is a view that illustrates a pixel array of the image sensor 107 shown in FIG. 1 according to the fourth embodiment that shows a pixel range of 8 columns×8 rows, and that shows a state when the image sensor 107 is observed from the photographing optical system side. A known Bayer array is applied for the color filters, in which G (green) and R (red) color filters are alternately provided in order from the left side on pixels of odd-numbered rows. Further, B (blue) and G color filters are alternately provided in order from the left side on pixels of even-numbered rows. Circles denoted by reference characters $11i$ to $15i$ each represent an on-chip microlens. A plurality of rectangles $11a$ to $11d$, $12a$ to $12d$, $13a$ to $13d$, $14a$ to $14d$, and $15a$ to $15d$ arranged inside the on-chip microlenses $11i$ to $15i$ represent photoelectric conversion portions.

In the fourth embodiment, the four divided photoelectric conversion portions are arranged in all the pixels. A configuration is adopted such that an output signal of each of the four divided photoelectric conversion portions can be read out independently. However, the division pattern is not uniform for all pixels, and the image sensor 107 is constituted by five kinds of image sensing pixel groups that have different division patterns to each other. The characteristics of these image sensing pixel groups are described below.

The first pixel 11 is divided in two in the X direction and the Y direction, respectively, by separation bands that intersect at a position that deviates in the −X direction and +Y direction from the center of the pixel unit. Thus, the first pixel 11 has a total of four photoelectric conversion portions $11a$ to $11d$. The divided photoelectric conversion portions $11a$ to $11d$ of two by two array in the vertical and lateral directions are configured so that they are projected on the exit pupil of the photographing optical system by means of the on-chip microlens $11i$, and light fluxes from an object that are transmitted through different regions of the exit pupil of the photographing optical system arrive at the photoelectric conversion portions $11a$ to $11d$.

The second pixel 12 is divided in two in the X direction and the Y direction, respectively, by separation bands that intersect at a position that deviates in the +X direction and +Y direction from the center of the pixel unit. Thus, the second pixel 12 has a total of four photoelectric conversion portions $12a$ to $12d$. The divided photoelectric conversion portions $12a$ to $12d$ of two by two array in the vertical and lateral directions are configured so that they are projected on the exit pupil of the photographing optical system by means of the on-chip microlens $12i$, and light fluxes from an object that are transmitted through different regions of the exit pupil of the photographing optical system arrive at the photoelectric conversion portions $12a$ to $12d$.

The third pixel 13 is divided in two in the X direction and the Y direction, respectively, by separation bands that intersect at a position that deviates in the −X direction and −Y direction from the center of the pixel unit. Thus, the third pixel 13 has a total of four photoelectric conversion portions $13a$ to $13d$. The divided photoelectric conversion portions $13a$ to $13d$ of two by two array in the vertical and lateral directions are configured so that they are projected on the exit pupil of the photographing optical system by means of the on-chip microlens $13i$, and light fluxes from an object that are transmitted through different regions of the exit pupil of the photographing optical system arrive at the photoelectric conversion portions $13a$ to $13d$.

The fourth pixel 14 is divided in two in the X direction and the Y direction, respectively, by separation bands that intersect at a position that deviates in the +X direction and −Y direction from the center of the pixel unit. Thus, the fourth pixel 14 has a total of four photoelectric conversion portions $14a$ to $14d$. The divided photoelectric conversion portions $14a$ to $14d$ of two by two array in the vertical and lateral directions are configured so that they are projected on the exit pupil of the photographing optical system by means of the on-chip microlens 14$i$, and light fluxes from an object that are transmitted through different regions of the exit pupil of the photographing optical system arrive at the photoelectric conversion portions 14$a$ to 14$d$.

The fifth pixel 15 is divided in two in the X direction and the Y direction, respectively, by separation bands that intersect at the center of the pixel unit. Thus, the fifth pixel 15 has a total of four photoelectric conversion portions 15$a$ to 15$d$. The four divided photoelectric conversion portions 15$a$ to 15$d$ are configured so that they are projected on the exit pupil of the photographing optical system by means of the on-chip microlens 15$i$, and light fluxes from an object that are transmitted through different regions of the exit pupil of the photographing optical system arrive at the photoelectric conversion portions 15$a$ to 15$d$.

By independently reading out the output signals obtained from the photoelectric conversion portions 11$a$ to 11$d$, 12$a$ to 12$d$, 13$a$ to 13$d$, 14$a$ to 14$d$, and 15$a$ to 15$d$, respectively, it is possible to acquire parallax images and perform focus detection. On the other hand, by combining the outputs obtained from the photoelectric conversion portions 11$a$ to 11$d$, combining the outputs obtained from the photoelectric conversion portions 12$a$ to 12$d$, combining the outputs obtained from the photoelectric conversion portions 13$a$ to 13$d$, combining the outputs obtained from the photoelectric conversion portions 14$a$ to 14$d$, and combining the outputs obtained from the photoelectric conversion portions 15$a$ to 15$d$ and reading out the resultant outputs, pixel outputs with respect to light fluxes transmitted through all regions of the exit pupil of the photographing optical system can be acquired, and a normal photographic image can be formed.

FIG. 9A to FIG. 9E are cross-sectional views that illustrate the configurations of the first to fifth pixels shown in FIG. 8, respectively. FIG. 9A to FIG. 9E show cross-sections as viewed from the +X direction and −Y direction, respectively.

Figure 9A:
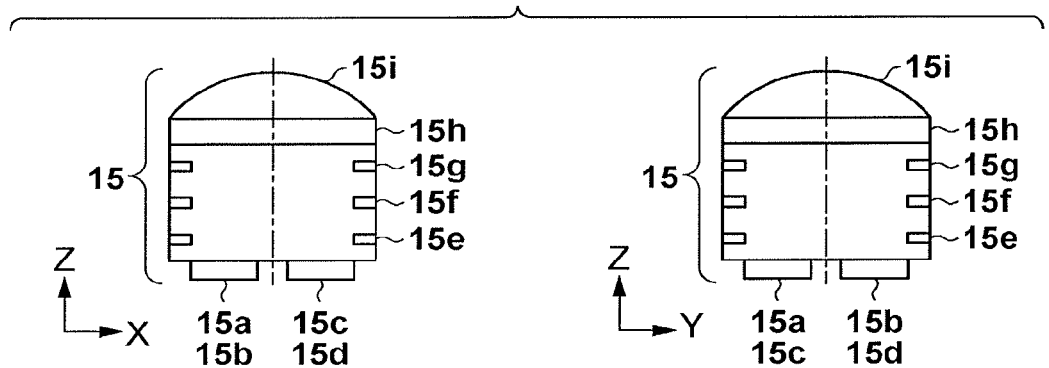
FIG. 9A to FIG. 9E are views that show dividing positions of photoelectric conversion elements in a pixel unit.

FIG. 9A includes central cross-sectional views of the fifth pixel 15, in which reference numerals 15$e$ to 15$g$ denote aluminum wiring layers, reference numeral 15$h$ denotes a color filter layer, reference numeral 15$i$ denotes the on-chip microlens, and reference numerals 15$a$ to 15$d$ denote the photoelectric conversion portions.

Figure 9B:
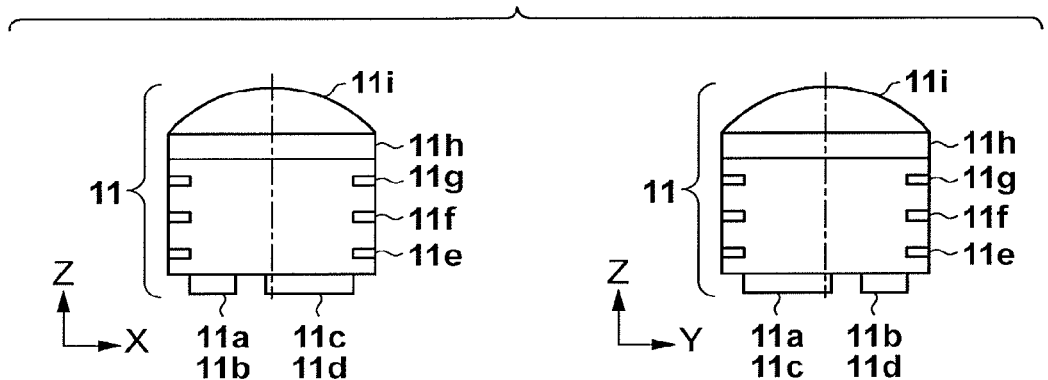

FIG. 9B includes central cross-sectional views of the first pixel 11, in which reference numerals 11$e$ to 11$g$ denote aluminum wiring layers, reference numeral 11$h$ denotes a color filter layer, reference numeral 11$i$ denotes the on-chip microlens, and reference numerals 11$a$ to 11$d$ denote the photoelectric conversion portions.

Figure 9C:
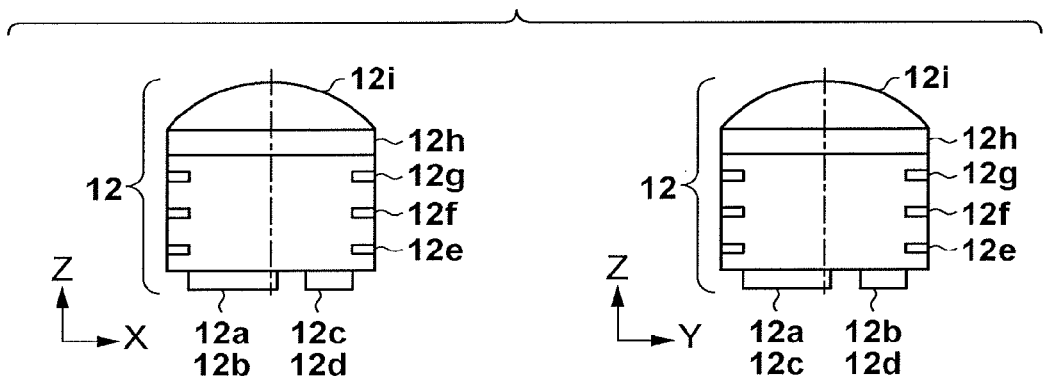

FIG. 9C includes central cross-sectional views of the second pixel 12, in which reference numerals 12$e$ to 12$g$ denote aluminum wiring layers, reference numeral 12$h$ denotes a color filter layer, reference numeral 12$i$ denotes an on-chip microlens, and reference numerals 12$a$ to 12$d$ denote photoelectric conversion portions.

Figure 9D:
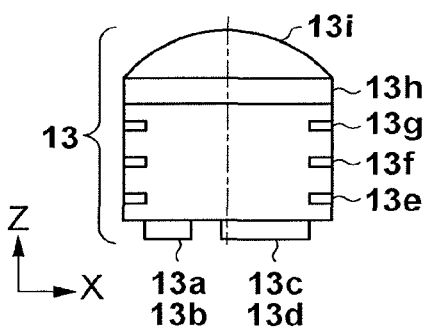
Figure 9D:
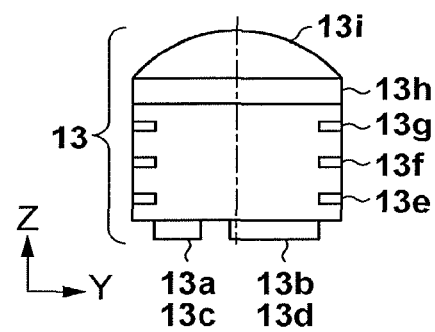

FIG. 9D includes central cross-sectional views of the third pixel 13, in which reference numerals 13$e$ to 13$g$ denote aluminum wiring layers, reference numeral 13$h$ denotes a color filter layer, reference numeral 13$i$ denotes the on-chip microlens, and reference numerals 13$a$ to 13$d$ denote the photoelectric conversion portions.

Figure 9E:
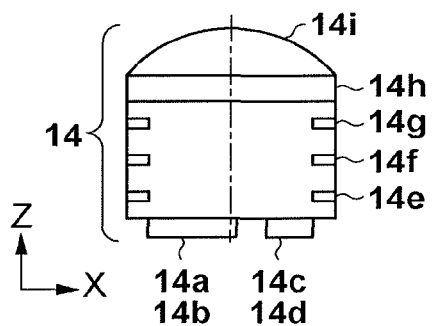
Figure 9E:
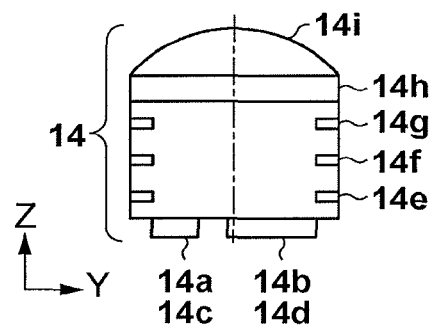

FIG. 9E includes central cross-sectional views of the fourth pixel 14, in which reference numerals 14$e$ to 14$g$ denote aluminum wiring layers, reference numeral 14$h$ denotes a color filter layer, reference numeral 14$i$ denotes the on-chip microlens, and reference numerals 14$a$ to 14$d$ denote the photoelectric conversion portions.

As described above, the light-receiving sensitivity decreases at a separation band that separates the photoelectric conversion portions. When a light flux from an object reaches the vicinity of the separation band, an output signal that is obtained decreases. The influence of the separation band increases as the light flux from the object approaches the position of the separation band, and also increases as the f-number of the light flux becomes darker.

According to the pixel array disclosed in Japanese Patent Laid-Open No. 2009-015164, for example, the division patterns of photoelectric conversion portions of pixels that are adjacent to each other are the same, and therefore the above described influence arises in the same manner in adjacent pixels. Consequently, when the influence of a dividing position in a certain pixel unit is extremely large and a favorable output can not be obtained, a favorable output can likewise not be obtained from all of the adjacent pixels.

In contrast, according to the fourth embodiment, as described above, a configuration is adopted so as to vary the division patterns of photoelectric conversion portions of pixel units that are adjacent to each other. The fourth embodiment is also configured so as to vary division patterns of photoelectric conversion portions even between adjacent pixels that have color filters of the same color. By adopting this configuration, pixels whose pixel output decreases arise in a discrete manner even when the aperture-shutter 102 of the photographing optical system is narrowed. Therefore, a deterioration in the image quality can be prevented by performing correction according to the same principles as for ordinary defective pixels. In this connection, examples of a correction method include a known method such as performing interpolation based on adjacent pixels, and multiplying a pixel output by a coefficient.

Note that although an example is described above in which five kinds of division patterns are used, a configuration may also be adopted in which photoelectric conversion portions are divided by a greater number of kinds of division patterns.

<Fifth Embodiment>

Figure 10:
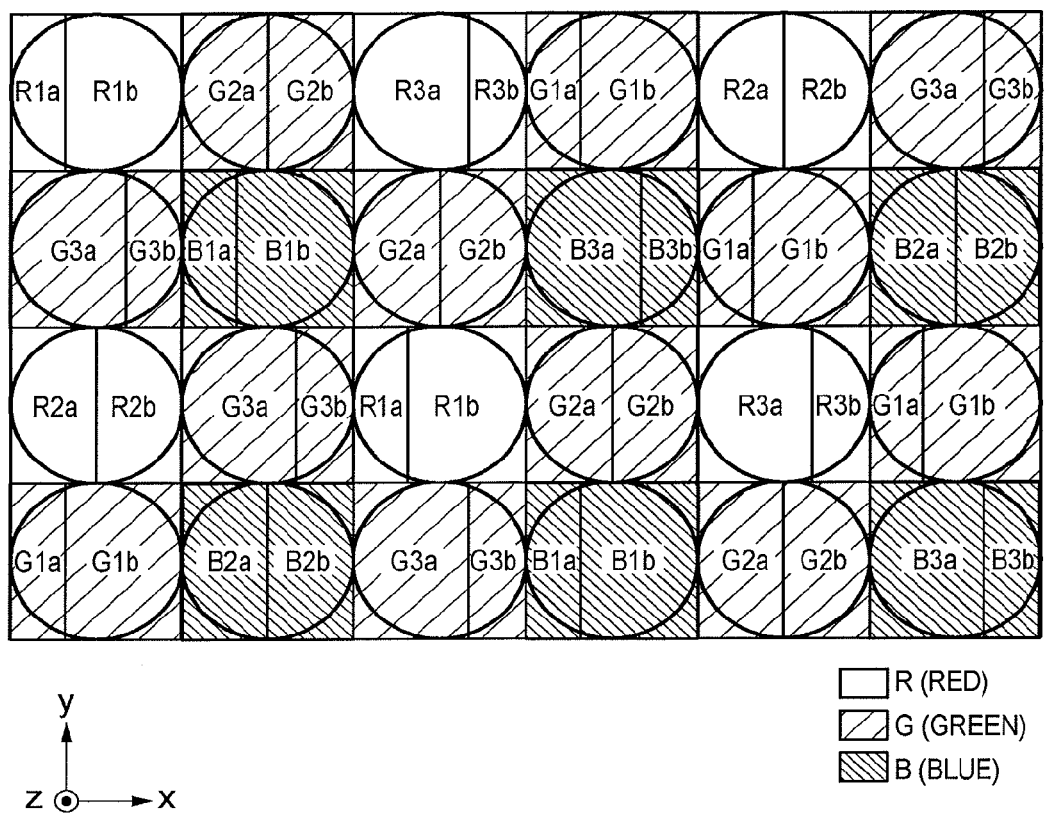
FIG. 10 is a schematic view of a pixel array according to a fifth embodiment.

Next, a fifth embodiment of the present invention is described. FIG. 10 is a view that illustrates a pixel array of the image sensor 107 shown in FIG. 1 according to the fifth embodiment that shows a pixel range of 4 columns×6 rows, and that shows a state when the image sensor 107 is observed from the photographing optical system side. A known Bayer array is applied for the color filters, in which R (red) and G (green) color filters are alternately provided in order from the left side on pixels of odd-numbered rows. Further, G and B (blue) color filters are alternately provided in order from the left side on pixels of even-numbered rows. A circle in each pixel represents a microlens. Reference characters R1$a$ to R3$a$ and R1$b$ to R3$b$ of the R pixels, reference characters G1$a$ to G1$a$ and G1$b$ to G3$b$ of the G pixels, and reference characters B1$a$ to B3$a$ and B1$b$ to B3$b$ of the B pixels denote photoelectric conversion portions.

According to the fifth embodiment, the photoelectric conversion portions of all the pixels are divided in two in the horizontal direction. A configuration is adopted such that an output signal of each of the two divided photoelectric conversion portions can be read out independently. However, the division pattern is not uniform for all pixels, and the image sensor 107 is constituted by three kinds of image sensing pixel groups that have different division patterns to each other.

The photoelectric conversion portion R1a (G1a, B1a) and the photoelectric conversion portion R1b (G1b, B1b) of the first pixel are separated in the horizontal direction by a separation band at a position that is eccentric in the −x direction relative to the pixel center.

The photoelectric conversion portion R2a (G2a, B2a) and the photoelectric conversion portion R2b (G2b, B2b) of the second pixel are separated in the horizontal direction by a separation band at the center position of the pixel.

The photoelectric conversion portion R3a (G3a, B3a) and the photoelectric conversion portion R3b (G3b, B3b) of the third pixel are separated in the horizontal direction by a separation band at a position that is eccentric in the +x direction relative to the pixel center.

By independently reading out the output signals obtained from the photoelectric conversion portions G1a to G3a, G1b to G3b, R1a to R3a, R1b to R3b, B1a to B3a, and B1b to B3b, respectively, it is possible to acquire parallax images and perform focus detection. On the other hand, by combining the outputs obtained from the photoelectric conversion portion G1a (R1a, B1a) and the photoelectric conversion portion G1b (R1b, B1b) and reading out the combined output signal, a normal photographic image can be formed. Further, by combining the outputs obtained from the photoelectric conversion portion G2a (R2a, B2a) and the photoelectric conversion portion G2b (R2b, B2b) and reading out the combined output signal, a normal photographic image can be formed. Likewise, by combining the outputs obtained from the photoelectric conversion portion G3a (R3a, B3a) and the photoelectric conversion portion G3b (R3b, B3b) and reading out the combined output signal, a normal photographic image can be formed.

According to the pixel array disclosed in Japanese Patent Laid-Open No. 2009-015164, for example, the division patterns of photoelectric conversion portions of pixels that are adjacent to each other are the same, and therefore the above described influence arises in the same manner in adjacent pixels. Consequently, when the influence of a dividing position in a certain pixel unit is extremely large and a favorable output can not be obtained, a favorable output can likewise not be obtained from all of the adjacent pixels.

In contrast, according to the fifth embodiment, as described above, a configuration is adopted so as to vary the division patterns of photoelectric conversion portions of pixel units that are adjacent to each other. The fifth embodiment is also configured so as to vary the division patterns of photoelectric conversion portions even between adjacent pixels that have color filters of the same color. By adopting this configuration, pixels whose pixel output decreases arise in a discrete manner even when the aperture-shutter 102 of the photographing optical system is narrowed. Therefore, a deterioration in the image quality can be prevented by performing correction according to the same principles as for ordinary defective pixels. In this connection, examples of a correction method include a known method such as performing interpolation based on adjacent pixels, and multiplying a pixel output by a coefficient.

Note that although an example is described above in which three kinds of division patterns are used, a configuration may also be adopted in which photoelectric conversion portions are divided by a greater number of kinds of division patterns.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2011-094370 filed on Apr. 20, 2011 and 2012-015936 filed on Jan. 27, 2012, which are hereby incorporated by reference herein in their entirety.

What is claimed is:

1. An image sensor comprising a plurality of image sensing pixels including a first pixel, a second pixel that is adjacent to the first pixel in a first direction, a third pixel that is adjacent to the first pixel in a second direction that is perpendicular to the first direction and a fourth pixel that is adjacent to the first pixel in a second direction and located opposite side of the first pixel to the third pixel in the second direction, wherein:

each of the first pixel, the second pixel, the third pixel and the fourth pixel includes a plurality of photoelectric conversion portions which photoelectrically convert a plurality of images and are separated by a separation band in the first direction;

the plurality of photoelectric conversion portions output focus detection signals that are used for phase difference detection;

the separation bands arranged in the first pixel and the separation band arranged in the second pixel deviate in the first direction, and the separation band arranged in at least one of the third pixel and the fourth pixel deviates differently from the first pixel in the first direction.

2. The image sensor according to claim 1, wherein each of the plurality of pixels has a color filter, and a fifth pixel, having a color filter of a same color as the first pixel, that is adjacent to the second pixel in the first direction and has photoelectric conversion portions that are separated by the separation band in a division pattern that is different from a division pattern of the first pixel in the first direction.

3. The image sensor according to claim 1, wherein a number of divisions of the photoelectric conversion portions comprising each pixel is identical for each of the pixels.

4. An image capturing apparatus, including:
an image sensor according to claim 1; and
a control unit configured to perform focus adjustment by a phase difference detection method using the focus detection signals.

5. The image sensor according to claim 1, wherein the plurality of photoelectric conversion portions included in each of the first pixel and the second pixel are separated by a plurality of separation bands in the first direction and second direction that is perpendicular to the first direction.

6. The image sensor according to claim 5, wherein the photoelectric conversion portions of the third pixel are separated by a separation band in a similar deviation to the deviation of the first pixel in the first direction.

7. The image sensor according to claim 6, wherein each of the plurality of pixels has a color filter; and
the fourth pixel having a color filter of a color different from the first pixel.

8. The image sensor according to claim 1, wherein the first direction is a horizontal direction.

* * * * *